(12) United States Patent
Chen et al.

(10) Patent No.: US 7,759,653 B2
(45) Date of Patent: Jul. 20, 2010

(54) ELECTRON BEAM APPARATUS

(75) Inventors: Zhong-Wei Chen, San Jose, CA (US);
Xuedong Liu, Cupertino, CA (US); Xu Zhang, Hayward, CA (US); Weiming Ren, San Jose, CA (US); Juying Dou, San Jose, CA (US)

(73) Assignee: Hermes Microvision, Inc., Hsinchu (TW)

( * ) Notice: Subject to any disclaimer, the term of this patent is extended or adjusted under 35 U.S.C. 154(b) by 237 days.

(21) Appl. No.: 12/130,879

(22) Filed: May 30, 2008

(65) Prior Publication Data
US 2009/0294664 A1 Dec. 3, 2009

(51) Int. Cl.
*H01J 37/00* (2006.01)
*H01J 37/28* (2006.01)

(52) U.S. Cl. ............... 250/396 ML; 250/310; 250/396 R; 250/397; 250/398; 250/492.22

(58) Field of Classification Search .................. None
See application file for complete search history.

(56) References Cited

U.S. PATENT DOCUMENTS

| | | | | |
|---|---|---|---|---|
| 4,808,821 A * | 2/1989 | Feuerbaum et al. | ......... | 250/305 |
| 4,926,054 A * | 5/1990 | Frosien | ................... | 250/396 R |
| 5,665,968 A * | 9/1997 | Meisburger et al. | ......... | 250/310 |
| 5,717,204 A * | 2/1998 | Meisburger et al. | ......... | 250/310 |
| 6,365,896 B1 * | 4/2002 | van der Mast | ............... | 250/310 |
| 6,380,546 B1 * | 4/2002 | Petrov et al. | ............ | 250/396 R |
| 6,392,231 B1 * | 5/2002 | Chen | .......................... | 250/310 |
| 6,407,387 B1 * | 6/2002 | Frosien et al. | .............. | 250/310 |
| 6,605,805 B2 * | 8/2003 | Chen | .......................... | 250/310 |
| 6,960,766 B2 * | 11/2005 | Chen | ............................. | 850/1 |
| 7,544,937 B2 * | 6/2009 | Frosien | ........................ | 250/310 |
| 7,645,989 B2 * | 1/2010 | Bihr et al. | .................... | 250/311 |
| 7,652,263 B2 * | 1/2010 | Feuerbaum | ............. | 250/396 R |
| 2009/0090866 A1 | 4/2009 | Zhang | | |

* cited by examiner

*Primary Examiner*—David A Vanore
(74) *Attorney, Agent, or Firm*—Sawyer Law Group, P.C.

(57) ABSTRACT

The present invention includes an electron beam device for examining defects on semiconductor devices. The device includes an electron source for generating a primary electron beam, wherein the total acceleration potential is divided and is provided across the ground potential. Also included is at least one condenser lens for pre-focusing the primary electron beam, an aperture for confining the primary electron beam to ameliorate electron-electron interaction, wherein the aperture is positioned right underneath the last condenser lens, and a SORIL objective lens system for forming immersion magnetic field and electrostatic field to focus the primary beam onto the specimen in the electron beam path. A pair of grounding rings for providing virtual ground voltage potential to those components within the electron beam apparatus installed below a source anode and above a last polepiece of the SORIL objective lens.

11 Claims, 6 Drawing Sheets

ELECTRON BEAM APPARATUS

FIELD OF THE INVENTION

The invention relates to an electron beam inspection system and specifically the present invention relates to a low landing energy, high resolution low current system for electron beam inspection.

BACKGROUND OF THE INVENTION

An electron beam inspection system has many applications during semiconductor chip fabrication process. For example, besides using the system in process wafer inspection, photomask inspection, linewidth, other critical dimension of device structures may also be measured with the electron beam system. However, as the linewidth shrinks from the order of micrometer to the order of nanometer there is, more and more demand for a higher resolution and lower landing energy electron beam system for semiconductor related observation.

SUMMARY OF THE INVENTION

The present invention includes an electron beam system for a next generation inspection tool with a higher resolution and lower landing energy by reducing chromatic aberration of the objective lens and having less electron-electron interaction within the primary electron beam.

The present invention includes an electron beam device for examining defects on semiconductor devices. The device includes an electron source for generating a primary electron beam, wherein the total acceleration potential is divided and is provided across the ground potential. Also included is at least one condenser lens for pre-focusing the primary electron beam, an aperture for confining the primary electron beam to ameliorate electron-electron interaction, wherein the aperture is positioned right underneath the last condenser lens, and a SORIL objective lens system for forming immersion magnetic field and electrostatic field to focus the primary beam onto the specimen in the electron beam path. A pair of grounding rings for providing virtual ground voltage potential to those components within the electron beam apparatus installed below a source anode and above a last polepiece of the SORIL objective lens. There is at least one pair of deflectors for deflecting the primary electron beam over the specimen surface to form a scanning pattern. A detection system is provided for detecting signal electrons and a stage holds the specimen to be inspected.

In order to ameliorate the chromatic aberration of the electron beam apparatus, one embodiment disclose an acceleration voltage potential higher than other conventional potential. The acceleration potential is applied in a special way directly across the cathode and the anode.

The other embodiment disclose a method to ameliorate the electron-electron interaction or the Boersch effect within the primary beam by position the aperture right beneath the condenser lens.

Another embodiment disclose a method to reduce micro-arcing during operation by lowering the stage floating voltage respect to ground potential. For example, the retarding potential set on the operation stage is down to −6 kV.

According to an embodiment of the present invention, the scintillator-photomultiplier combination detector for detecting the secondary electrons is sitting on +4 kV potential, in order to have 10 kV bias for the best detecting result.

And yet another embodiment of the present invention disclose a second method to ameliorate the electron-electron interaction within the primary beam by reducing electron interaction time.

DETAILED DESCRIPTION OF PREFERRED EMBODIMENTS

Figure 1:
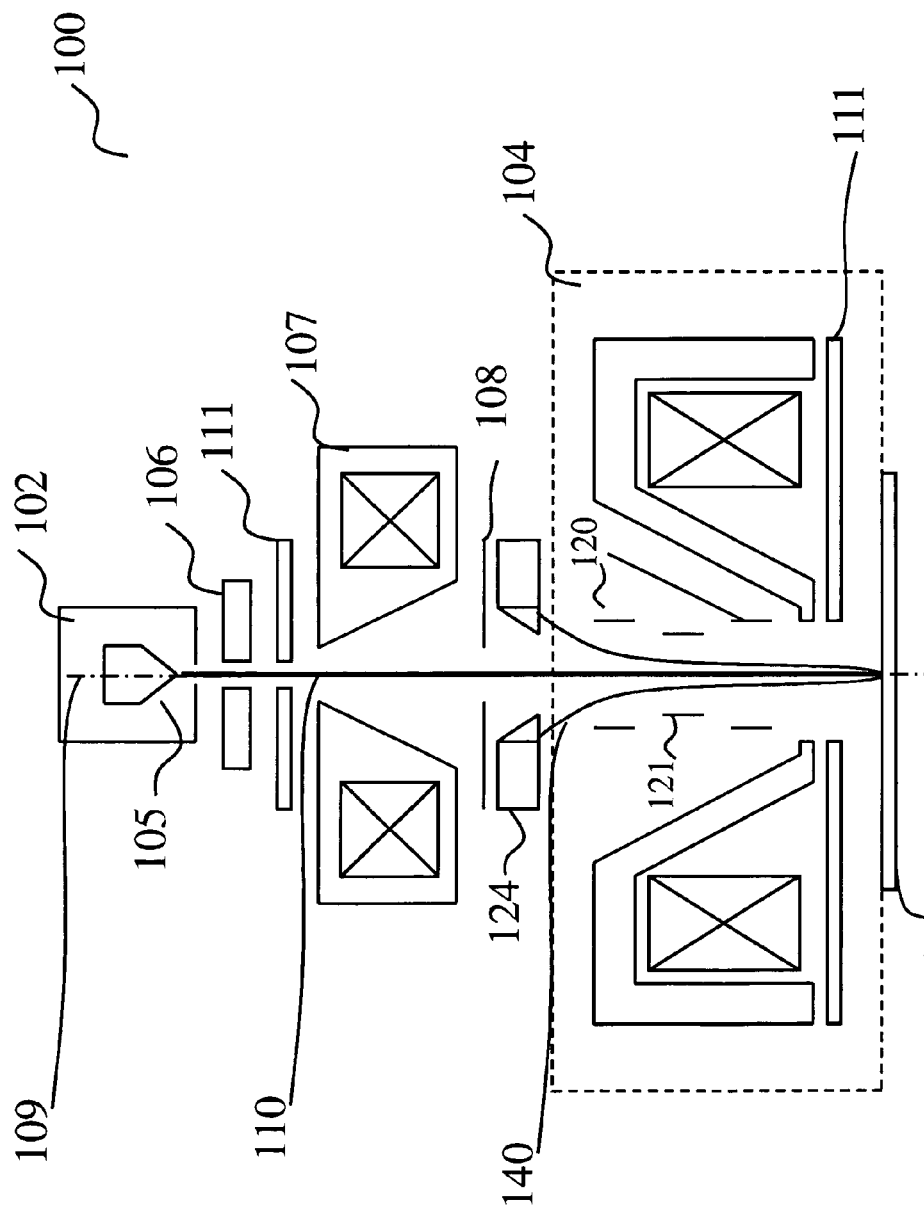
FIG. 1 is a schematic diagrammatic representation of a charged particle apparatus according to an embodiment of the present invention.

The present invention relates generally to an electron beam inspection system. The following description is presented to enable one of ordinary skill in the art to make and use the invention and is provided in the context of a patent application and its requirements. Various modifications to the preferred embodiment and the generic principles and features described herein will be readily apparent to those skilled in the art. Thus, the present invention is not intended to be limited to the embodiment shown but is to be accorded the widest scope consistent with the principles and features described herein.

Reference will now be made in detail to specific embodiments of the invention. Examples of these embodiments are illustrated in accompanying drawings. While the invention will be described in conjunction with these specific embodiments, it will be understood that it is not intended to limit the invention to these embodiments. On the contrary, it is intended to cover alternatives, modifications, and equivalents as may be included within the spirit and scope of the invention as defined by the appended claims. In the following description, numerous specific details are set forth in order to provide a through understanding of the present invention. The present invention may be practiced without some or all of these specific details. In other instances, well known process operations are not been described in detail in order not to unnecessarily obscure the present invention.

The present invention relates to an electron beam inspection system. More specifically, embodiments of the present invention are utilized with Swinging Objective Retarding Immersion Lens (SORIL) system to provide a low landing energy, high resolution low current system for electron beam inspection. More specifically, the present invention not only can be used on wafer inspection, but also on mask inspection and after development inspection (ADI). However, it would be recognized that the invention has a much broader range of applicability.

As mentioned above, the present invention a SORIL system disclosed by, for example, U.S. Pat. No. 6,392,231 is utilized to examine the specimen. The SORIL system includes a magnetic lens to generate a magnetic field in the vicinity of the specimen for focusing the electron beam on the specimen. The magnetic lens has a central bore through which electron beam travel toward the specimen. The SORIL system also includes an electrode to provide a retarding electric field to convert the high energy electron beam to a lower energy electron beam before strike onto the specimen surface to minimize damage to the specimen. Moreover, the SORIL system includes a plurality of deflecting unites situated along the beam axis for deflecting the electron beam to allow scanning of the specimen. At least one of the deflecting units is located in the retarding field to provide a relatively large deflecting field to reduce the time to fully examine the specimen. To describe the features of the present invention in more detail, refer to the following description.

FIG. 1 is a diagrammatic representation of an electron beam apparatus according to an embodiment of the present invention. The electron beam apparatus 100 includes an electron beam source 102, a cathode 105, an anode 106, a condenser lens 107, an aperture 108, and a SORIL objective lens system 104. Beam axis 109 is defined as the line connecting the electron beam source 102 and the specimen 122, which is the primary electron beam travel during inspection. Within the SORIL lens 104, around the beam axis 109, there are a plurality of deflection units 120 and ExB filter 121. The ExB filter 121 aligns or directs the secondary electron 140 (or signal electron) beam emanating from the specimen surface to detection system 124. The detection system 124 of the present invention is a scintillator-photomultiplier combination detector. This type of detector has higher sensitivity and lower noise to the secondary electrons 140 (or signal electrons) than a semiconductor type detector. However, the detecting system can also perform side view of the specimen when a segment detector is equipped onto the electron beam system as disclosed, for example, by Wang et al. in U.S. patent application 11/668846.

It is calculated by Chen et al. that in order to obtain a high resolution for an objective lens, relatively high electron beam energy, for example 15 keV or more, primary electron beam source is required. Applying such a high energy electron beam directly to the specimen may induce radiation damage on the substrate material, which consequently leads to a reliability problem in the emerging, manufacturing and production of integrated circuits. Therefore, a retarding field is generally equipped with the electron beam system to reduce the landing energy of the primary electron beam. Using a low energy primary electron beam source is a way to avoid the material damage induced reliability issue. However, lower electron beam energy will limits the spatial resolution by worse chromatic aberration of the objective lens and by more electron-electron interaction within the beam. Accordingly, both electron-electron interaction (space-charge effect) and chromatic aberration can ameliorated by using a higher energy electron beam.

Figure 2:
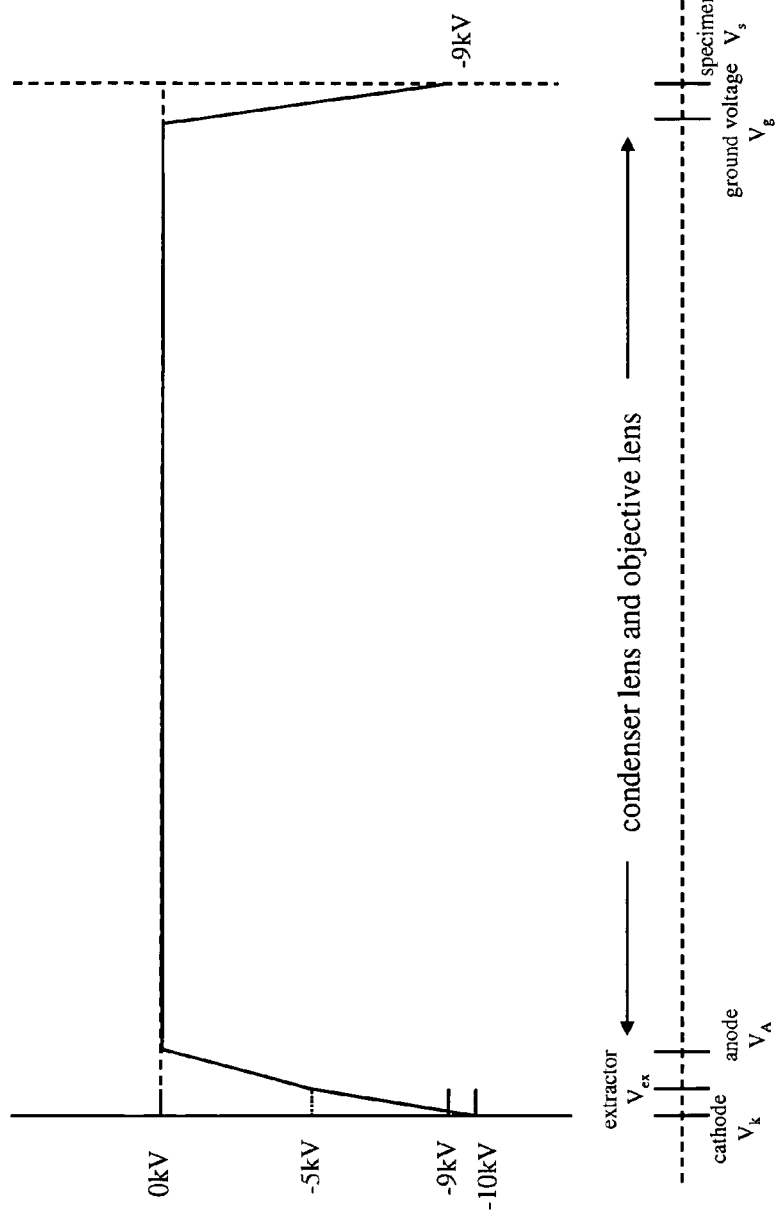
FIG. 2 is a diagrammatic representation of the axial potential distribution in voltage of a conventional column design.
Figure 3:
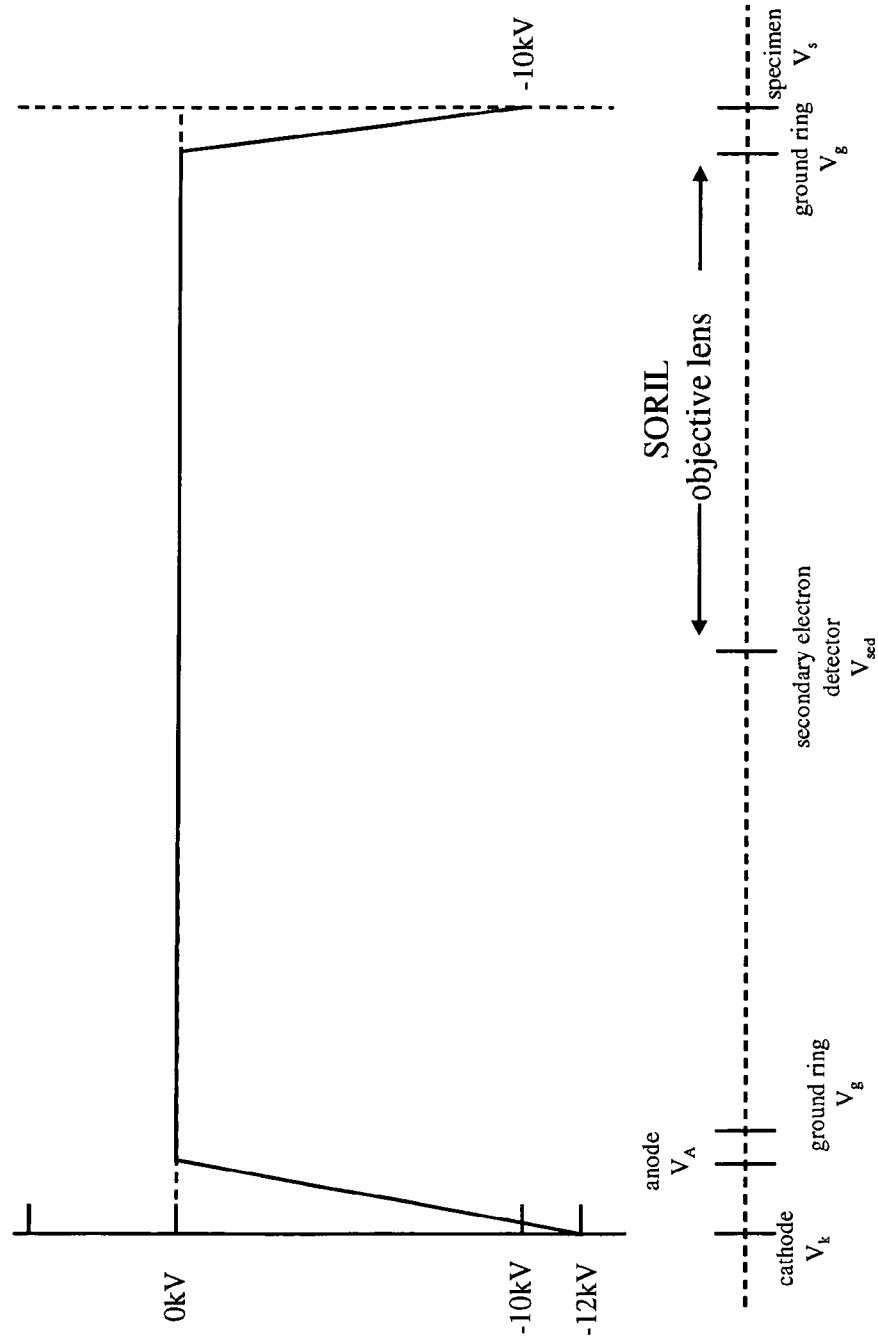
FIG. 3 is a diagrammatic representation of the axial potential distribution in voltage of a SORIL system disclosed by Chen et al.
Figure 4:
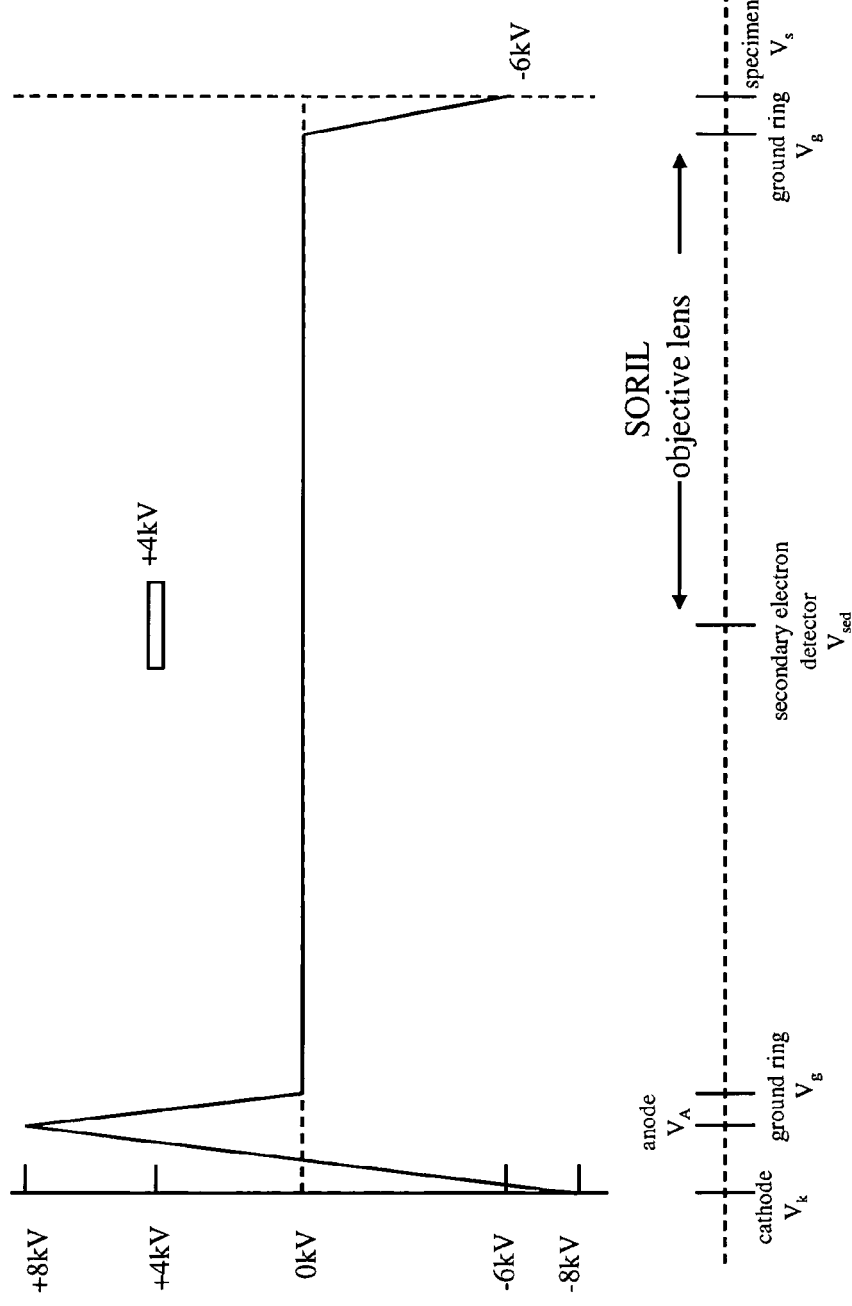
FIG. 4 is a diagrammatic representation of the axial potential distribution in voltage according to an embodiment of the present invention.

FIGS. 2, 3, and 4 are diagrams that illustrate axial electron potential energy of a conventional electron beam system, an electron beam system with SORIL lens and the present invention, respectively. Both of the two prior art electron beam source diagrams (2 and 3) do not have a beam energy that is as high as the present invention. Unlike the prior art, a system and method in accordance with the present invention does not use an extractor between the cathode 105 and anode 106 of the electron beam source 102. An extractor is designed to pull electrons out of cathode during the first generation of electron beam source. Conventionally, the electron acceleration potential is applied to the electrons in two steps with an extractor in between the cathode and anode. In the first step between the cathode and the extractor, about 3 to 5 kV are applied to pull electrons out. The second step applies the rest of the potential between the extractor and anode to accelerate electrons pulled out in the first step. The benefit of apply acceleration potential through the extractor is that it can keep stable the emission current of electron source stable. Another benefit of which is that process can accurately control the total acceleration potential applied on electrons with a control circuit setup between the circuit of extractor and anode.

Although the presence of extractor will provide a bigger total emission under a given emission angular intensity than without an extractor, it will also induce more electron-electron interaction in the meantime. As mentioned above, more electron-electron interaction is bad for chromatic aberration. The system has several features that allow for improved operation that will be described in detail hereinafter.

Direct Application of Acceleration Potential

The electron beam acceleration potential is directly applied across the cathode 105 and anode 106 no extractor is located in between. The electron beam acceleration potential, for example 16 keV, is applied to the electrons in such way as −8 kV on the cathode (Vk) and +8 kV on the anode (VA). After the primary beam 110 exit anode 106, the axial potential is dropped to virtual ground by a pair of grounding rings 111. The pair of grounding rings 111 provides a virtual ground voltage potential (Vg) to those components within the electron beam apparatus that installed below the source anode and above the last polepiece of SORIL objective lens. The primary beam electrons will then travel with a lower speed and energy for example, 8 keV. The primary beam 110 is then passed through the condenser lens 113 to pre-focus the beam and form a beam crossover if necessary. Following the condenser lens 113, an aperture 114 is set to confine the primary beam diameter to a range, for example, from 20 micrometer to 200 micrometer before passing through the SORIL 104 objective lens system. The SORIL 104 system also is at virtual ground (Vg). The benefit of operating at virtual ground is that the electrostatic operated deflecting units 120 can provide a fast response and larger field of view during the inspection process. The specimen 122 is charged to, for example, −6 kV (Vs) to provide a retarding electric field. The retarding electron field will decelerate the primary electron beam 110 before it impact with the specimen 122 of lower landing energy, for example 2 keV in the present experience.

Provided High Energy

As mentioned above, higher beam energy may ameliorate the chromatic aberration of the apparatus. The conventional and the SORIL electron beam both designed an over 10 kV electron acceleration voltage across the cathode (Vk, minus potential) and the anode (VA, ground potential). Such a high potential (over 10 kV) respect to the ground potential is very easy to induce micro-arcing during inspection process between the short distance between the polepiece of the objective lens and sample stage. In the present invention, the high acceleration voltage (16 kV) between the cathode and the anode is divided across the ground potential, for example −8 kV on cathode and +8 kV on anode. The present design reduces the voltage floating relative to the ground potential (−8 kV and +8 kV). On the sample stage with a retarding field the voltage is further reduced to −6 kV. Thus decreases the micro-arcing probability during operation.

Minimize Micro-Arcing Problem

An ameliorating electron-electron interaction or Boersch effect within the electron beam is disclosed utilizing this system. The present invention design set the aperture 114 is provided beneath the condenser lens 113 to trim down the excess electrons in the early stage.

Placing Detector at a Positive Potential

A detecting condition for the scintillator-photomultiplier detector 124 is disclosed utilizing this system. A scintillator-photomultiplier detector 124 is a very sensitive detector for detecting secondary electrons. However, the detector requires 10 kV bias to accelerate the secondary electrons 140 emanating from the specimen 122 surface to get the best result. For example, a specimen should be exposed to a retarding field of −6 kV, therefore, the detector 124 is designed to operate +4 kV (Vsed) for the best detecting result.

Energy Elevator

Figure 5:
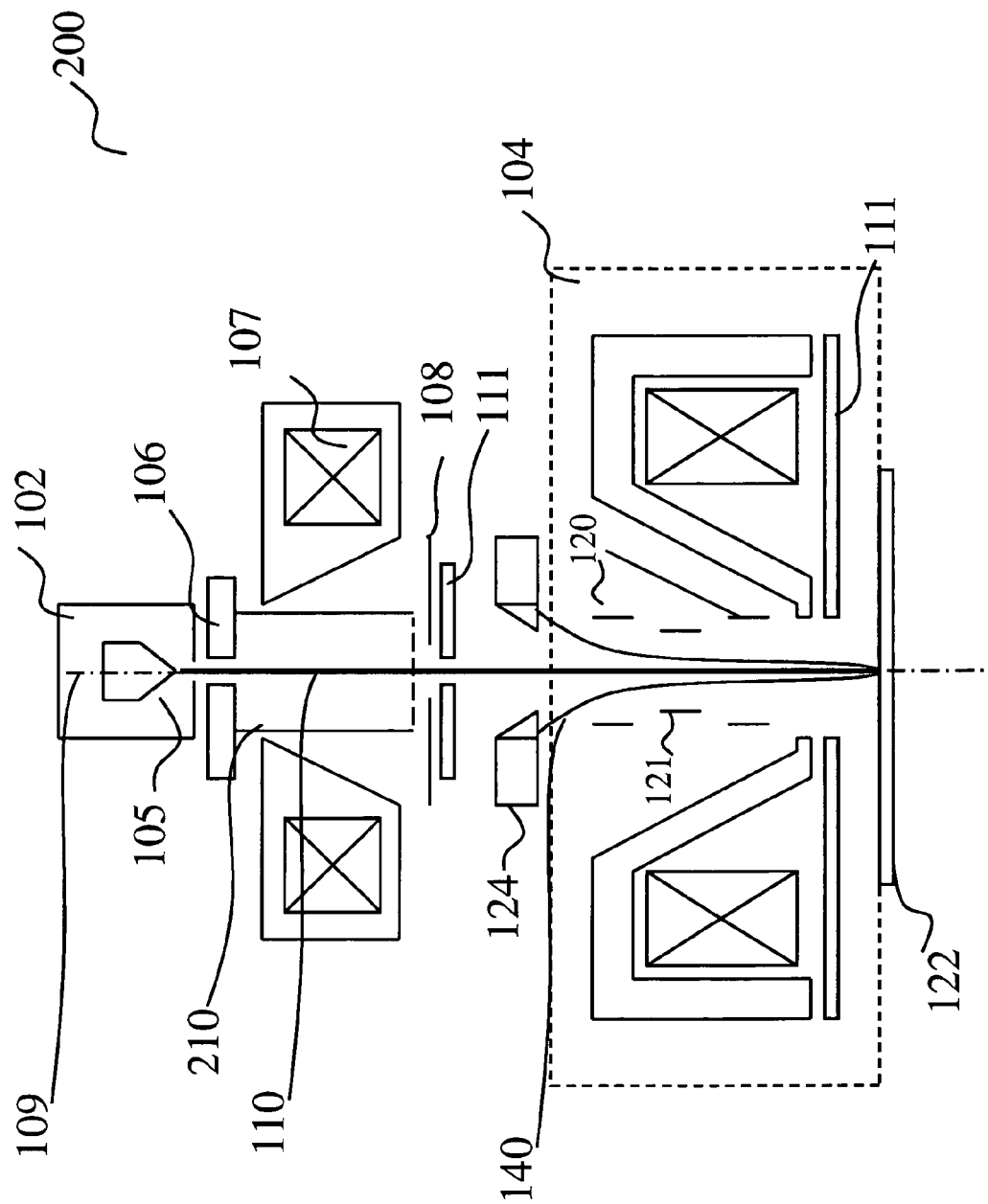
FIG. 5 is a schematic diagrammatic representation of a charged particle apparatus with energy elevator, according to an embodiment of the present invention.
Figure 6:
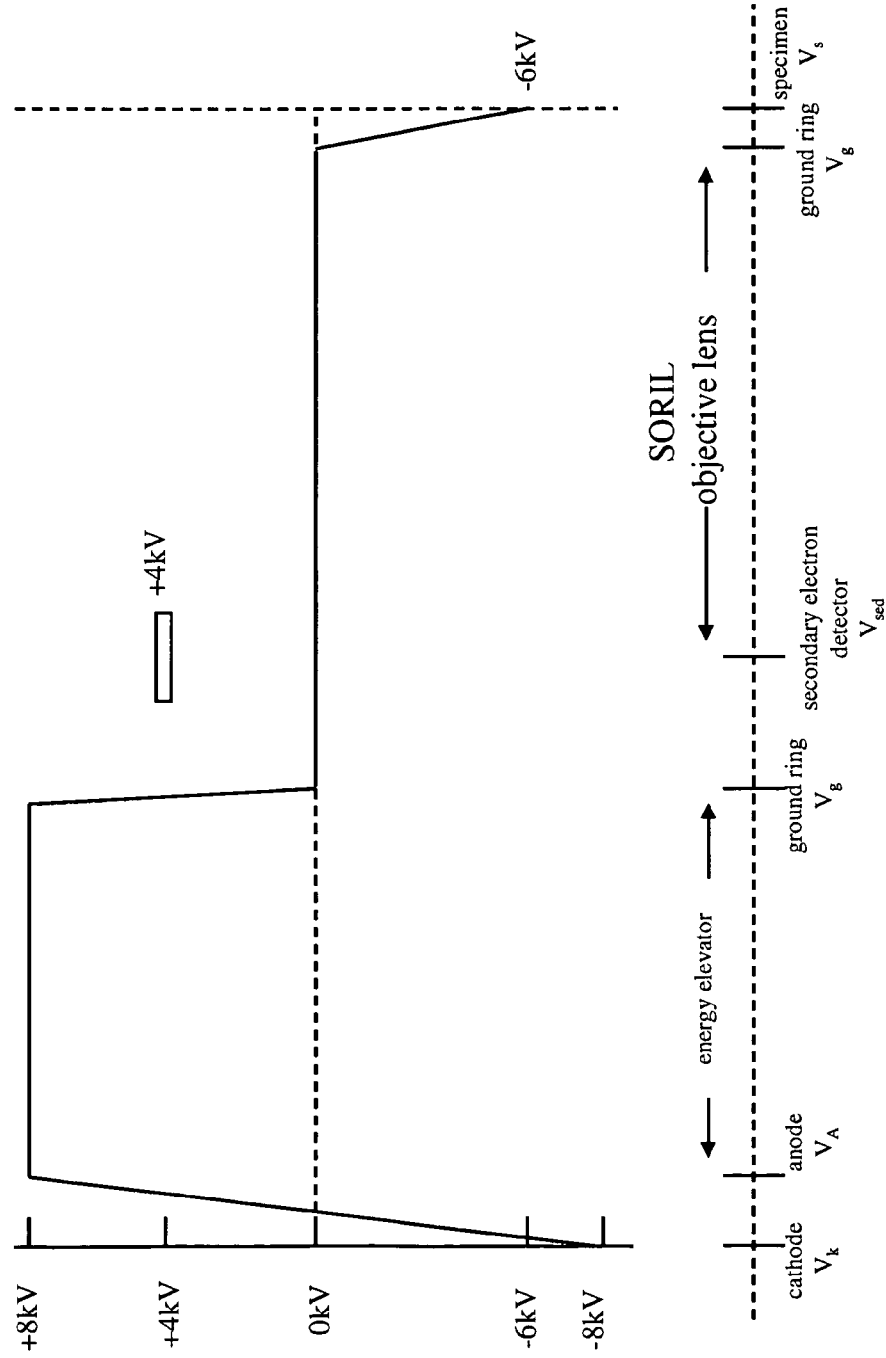
FIG. 6 is a diagrammatic representation of the axial potential distribution in voltage according to an embodiment with energy elevator of the present invention.

Another way to ameliorate the electron-electron interaction by shorten the time that electrons travel together is disclosed utilizing this system. It is well-known that electrons in a higher voltage potential electric field travel faster than which in a lower voltage potential electric field. An energy elevator 210 illustrated in FIG. 5, is designed for to keep the primary beam electrons in high energy condition before aperture. In this embodiment, the pair of grounding rings 111 provides virtual ground potential (Vg) to those components within the electron beam apparatus installed below the source anode and above the last polepiece of SORIL objective lens. FIG. 6 is a schematic diagrammatic representation of the axial potential distribution in voltage according to the embodiment with the energy elevator 210.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended.

What is claimed is:

1. An electron beam apparatus for examining defects on a semiconductor wafer device, the apparatus comprising:
   an electron source for generating a primary electron beam, wherein the total acceleration potential is divided and is provided across the ground potential;
   at least one condenser lens for pre-focusing the primary electron beam;
   an aperture for confining the primary electron beam to ameliorate electron-electron interaction, wherein the aperture is positioned right underneath the last condenser lens;
   a SORIL objective lens system for forming immersion magnetic field and electrostatic field to focus the primary beam onto the specimen in the electron beam path;
   a pair of grounding rings for providing virtual a ground voltage potential to those components within the electron beam apparatus installed below a source anode and above a last polepiece of the SORIL objective lens;
   at least one pair of deflectors for deflecting the primary electron beam over the specimen surface to form a scanning pattern;
   a detection system for detecting signal electrons; and
   a stage to hold the specimen to be inspected.

2. The electron beam apparatus according to claim 1, wherein the electron source is a Schottky emitter that includes a cathode and an anode, wherein there is no extractor between a cathode and an anode, and wherein the electron beam acceleration voltage potential is applied across the cathode and the anode, the SORIL objective lens system.

3. The electron beam apparatus in accordance to claim 1, wherein the detection system comprises scintillator-photomultiplier detectors.

4. The electron beam apparatus according to claim 3, wherein the scintillator-photomultiplier detector is on a voltage potential between zero volt and 10,000 volt.

5. The electron beam apparatus according to claim 1, wherein the stage is also applied to a voltage potential to achieve varied electron landing energy.

6. The electron beam apparatus according to claim 5, wherein the landing energy of the electron beam is chosen between 0 volt and 8,000 volt.

7. An electron bean apparatus for examining a semiconductor device, the apparatus comprising:
   an electron source for generating a primary electron beam, wherein the total acceleration potential is divided and across the ground potential;
   a beam elevator for electron beam traveling in an elevate voltage versus ground potential to minimize Boersch effect;
   at least one condenser lens for pre-focusing the primary electron beam;
   an aperture for confining the primary electron beam to ameliorate electron-electron interaction, wherein the aperture is positioned right underneath the last condenser lens;
   a SORIL objective lens system for forming immersion magnetic field and electrostatic field to focus the primary beam onto the specimen in the electron beam path;
   a pair of grounding rings for providing a virtual ground voltage potential to those components within the electron beam apparatus installed below the aperture and above a last polepiece of the SORIL objective lens;
   at least one pair of deflector for deflecting the primary electron beam over the specimen surface to form a scanning pattern;
   a detection system for detecting signal electrons; and
   a stage to hold the specimen to be inspected.

8. The electron beam apparatus according to claim 7, wherein the electron source is a Schottky emitter includes a cathode and an anode, wherein no extractor between the cathode and the anode, wherein the electron beam acceleration voltage potential is applied across the cathode and the anode.

9. The electron beam apparatus according to claim 7, wherein the beam elevator holds a constant voltage potential, and wherein the voltage potential applied is between 5,000 volt and 20,000 volt.

10. The electron beam apparatus according to claim 7, wherein the stage is also applied to a voltage potential to achieve varied electron landing energy.

11. The electron beam apparatus according to claim 10, wherein the landing energy of the electron beam is chosen between 0 volt and 8,000 volt.

* * * * *